United States Patent
Kang

(10) Patent No.: US 6,178,107 B1
(45) Date of Patent: Jan. 23, 2001

(54) FERROELECTRIC RANDOM ACCESS MEMORY DEVICE CAPABLE OF REDUCING OPERATION FREQUENCY OF REFERENCE CELL

(75) Inventor: Young-Min Kang, Ichon (KR)

(73) Assignee: Hyundai Electronics Industries Co., Ltd. (KR)

( * ) Notice: Under 35 U.S.C. 154(b), the term of this patent shall be extended for 0 days.

(21) Appl. No.: 09/428,110

(22) Filed: Oct. 27, 1999

(30) Foreign Application Priority Data

Oct. 28, 1998 (KR) .................................. 98-45301

(51) Int. Cl.$^7$ .................................. G11C 11/22
(52) U.S. Cl. ............ 365/145; 365/65; 365/189.07; 365/230.03; 365/230.06
(58) Field of Search .............. 365/145, 65, 189.07, 365/230.03, 230.06, 63, 129, 189.01, 230.01

(56) References Cited

U.S. PATENT DOCUMENTS

| | | | |
|---|---|---|---|
| 5,414,654 | 5/1995 | Kubota et al. ................ | 365/145 |
| 5,572,459 | 11/1996 | Wilson et al. ................ | 365/145 |
| 5,608,667 | * 3/1997 | Osawa ........................... | 365/145 |
| 5,638,318 | 6/1997 | Seyyedy ......................... | 365/145 |
| 5,689,468 | * 11/1997 | Ihara ............................. | 365/203 |
| 5,694,353 | 12/1997 | Koike ............................ | 365/145 |
| 5,751,626 | 5/1998 | Seyyedy ......................... | 365/145 |
| 5,751,628 | 5/1998 | Hirano et al. ................. | 365/145 |
| 5,822,237 | 10/1998 | Wilson et al. ................. | 365/145 |
| 5,905,672 | 5/1999 | Seyyedy ......................... | 365/145 |
| 5,959,922 | * 9/1999 | Jung ............................. | 365/210 |
| 5,963,466 | * 10/1999 | Evans, Jr. ...................... | 365/145 |

FOREIGN PATENT DOCUMENTS

| | | | |
|---|---|---|---|
| 2-110893 | 4/1990 | (JP) | G11C/11/401 |
| 3-283176 | 12/1991 | (JP) | G11C/11/22 |
| 4-192173 | 7/1992 | (JP) | G11C/11/22 |
| 5-28773 | 5/1993 | (JP) | G11C/11/56 |

* cited by examiner

Primary Examiner—David Nelms
Assistant Examiner—Hoai V. Ho
(74) Attorney, Agent, or Firm—Blakely Sokoloff Taylor & Zafman

(57) ABSTRACT

A ferroelectric random access memory (FeRAM) device, includes: a plurality of memory cells arranged in an M×J matrix, wherein M is a positive integer more than three and J is a positive integer; a number of reference cells connected to each column of the memory cells; and a cell selection means for selecting a memory cell in response to address signals from an external circuit and selecting a reference cell corresponding to the selected memory cell.

12 Claims, 2 Drawing Sheets

FERROELECTRIC RANDOM ACCESS MEMORY DEVICE CAPABLE OF REDUCING OPERATION FREQUENCY OF REFERENCE CELL

FIELD OF THE INVENTION

The present invention relates to a semiconductor device; and, more particularly, to a ferroelectric random access memory (FeRAM) device capable of reducing operation frequency of a reference cell.

DESCRIPTION OF THE PRIOR ART

Generally, a ferroelectric random access memory (FeRAM) device is a non-volatile semiconductor memory device, which employs the characteristics of a ferroelectric material having the residual polarity of a negative or positive direction. A structure of the ferroelectric random access memory is similar to that of a dynamic random access memory (DRAM) except that a storage element is made of the ferroelectric material.

In the FeRAM, there have been two conventional schemes in order to discriminate whether data written to a memory cell is "0" or "1". The first conventional scheme employs a plurality of memory cells arranged in a matrix, each of which includes two transistors and two ferroelectric capacitors. The data discrimination of the first conventional scheme is accomplished by using the two ferroelectric capacitors, which are connected to a pair of bit lines, e.g. a bit line and a bit line bar, wherein one ferroelectric capacitor is connected to the bit line and the other ferroelectric capacitor is connected to the bit line bar. That is, a "1" is written to one ferroelectric capacitor and a "0" is written to the other ferroelectric capacitor.

On the other hand, a second conventional scheme employs a plurality of memory cells arranged in a matrix, each of which includes one transistor and one ferroelectric capacitor, while one column of the memory cells is provided with one reference cell having a storage element, i.e. a ferroelectric capacitor. To discriminate whether data written to a memory cell is "0" or "1", the reference cell has the average of electric charges applied to a bit line. Accordingly, the data discrimination of the second conventional scheme is accomplished by using the reference cell, which discharges the average electric charges.

The second conventional scheme may reduce a cell area more than the first conventional scheme. However, every time each memory cell contained in the same column is selected, the corresponding reference cells should be also selected. Therefore, since operation frequency of the reference cell is greater than that of each memory cell contained in the same column, the ferroelectric capacitors of the corresponding reference cell are fatigued faster than the ferroelectric capacitor of each memory cell contained in the same column. As a result, the life span of the ferroelectric capacitor of the reference cell can be severely reduced, thereby affecting the reliance of the FeRAM.

SUMMARY OF THE INVENTION

It is, therefore, an object of the present invention to provide a ferroelectric random access memory (FeRAM) that reduces operation frequency of a reference cell, thereby reducing the fatigue of a ferroelectric capacitor of the reference cell.

In accordance with an aspect of the present invention, there is provided a ferroelectric random access memory (FeRAM) device, comprising: a plurality of memory cells arranged in an M×J matrix, wherein M is a positive integer more than three and J is a positive integer; a number of reference cells connected to each column of the memory cells; and a cell selection means for selecting a memory cell in response to address signals from an external circuit and selecting a reference cell corresponding to the selected memory cell.

BRIEF DESCRIPTION OF THE DRAWINGS

Other objects and aspects of the invention will become apparent from the following description of the embodiments with reference to the accompanying drawings, in which.

DETAILED DESCRIPTION OF THE INVENTION

Figure 1:
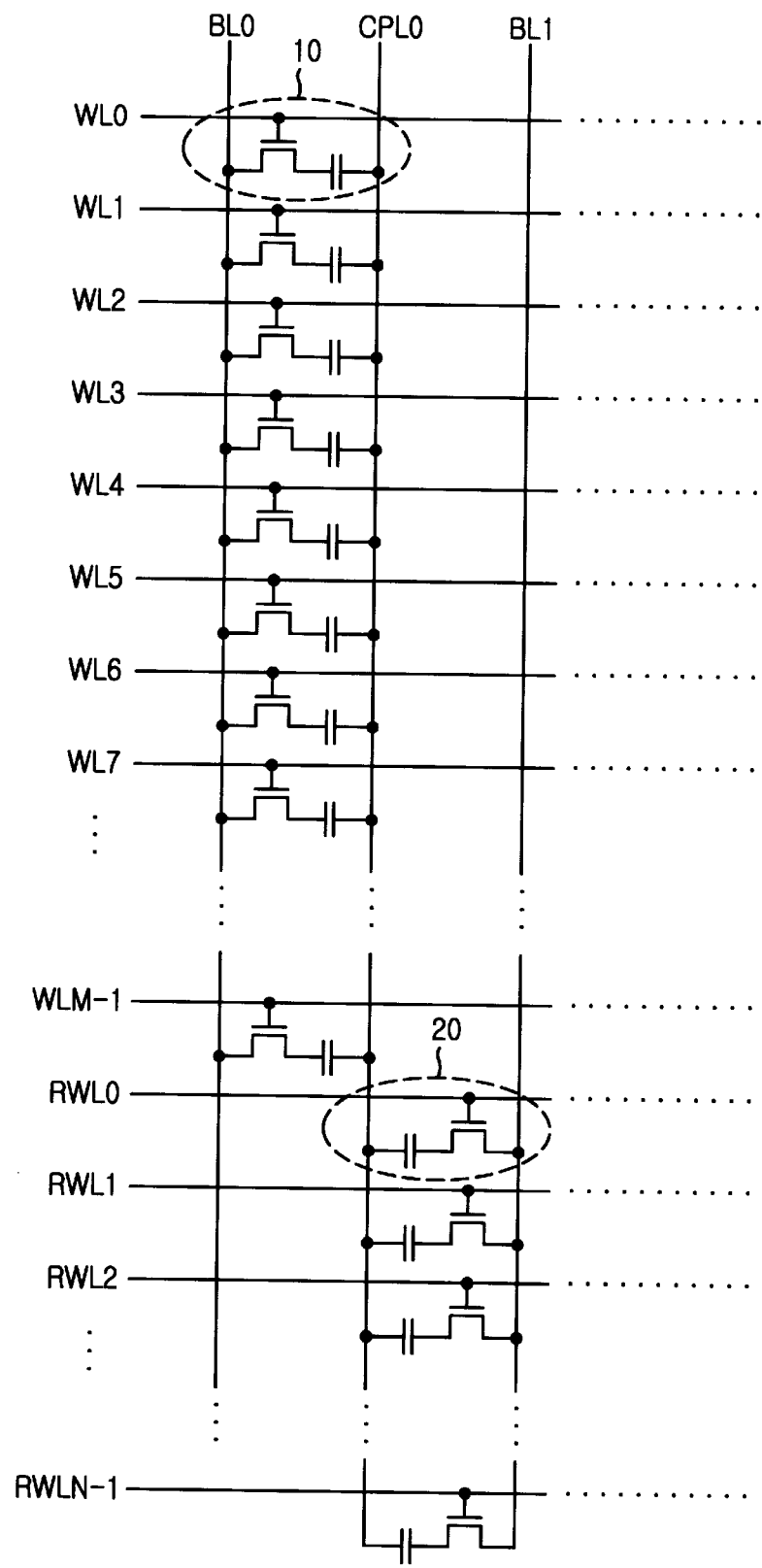
FIG. 1 is a circuit diagram showing memory cells and reference cells of a ferroelectric random access memory device in accordance with the present invention.

Referring to FIG. 1, a ferroelectric random access memory (FeRAM) device in accordance with the present invention includes a plurality of memory cells 10 connected to a bit line BL0 and a number of reference cells 20 connected to a bit line BL1 adjacent to the bit line BL0. The memory cells 10 is arranged in an M×J matrix, wherein M is a positive integer more than three and J is a positive integer. If the number of memory cells of each column is $M=2^N$, the number of reference cells is N. For example, if the number of the memory cells is $2^8$, the number of the reference cells is eight. The N number of reference cells 20 connected to each column of the memory cells 10. For the sake of convenience, an M×1 matrix of memory cells is shown in FIG. 1.

Also, a cell plate CP0 is positioned between the bit line BL0 and the bit line BL1. The memory cells 10, each of which includes one transistor and one ferroelectric capacitor. Similarly, the reference cells 20, each of which includes one transistor and one ferroelectric capacitor. When one of word lines (WL0 to WLM-1) is selected to operate one of the memory cells 10, a ferroelectric capacitor of the memory cell 10 operated discharges electric charges to the bit line BL0. When one of reference word lines (RWL0 to RWLN-1) is selected to operate one of reference cells 20, a ferroelectric capacitor of the reference cell 20 operated discharges electric charges to the bit line BL1.

Accordingly, the data discrimination is accomplished by comparing the electric charges of the reference cell 20 with that of the memory cell 10. At this time, the operation frequency of the reference cells 20 is reduced more than that of the conventional reference cell. Thus, the reduction of the magnitude of residual polarity can be delayed in the ferroelectric capacitor of the reference cells 20 and its life span can be increased.

Figure 2:
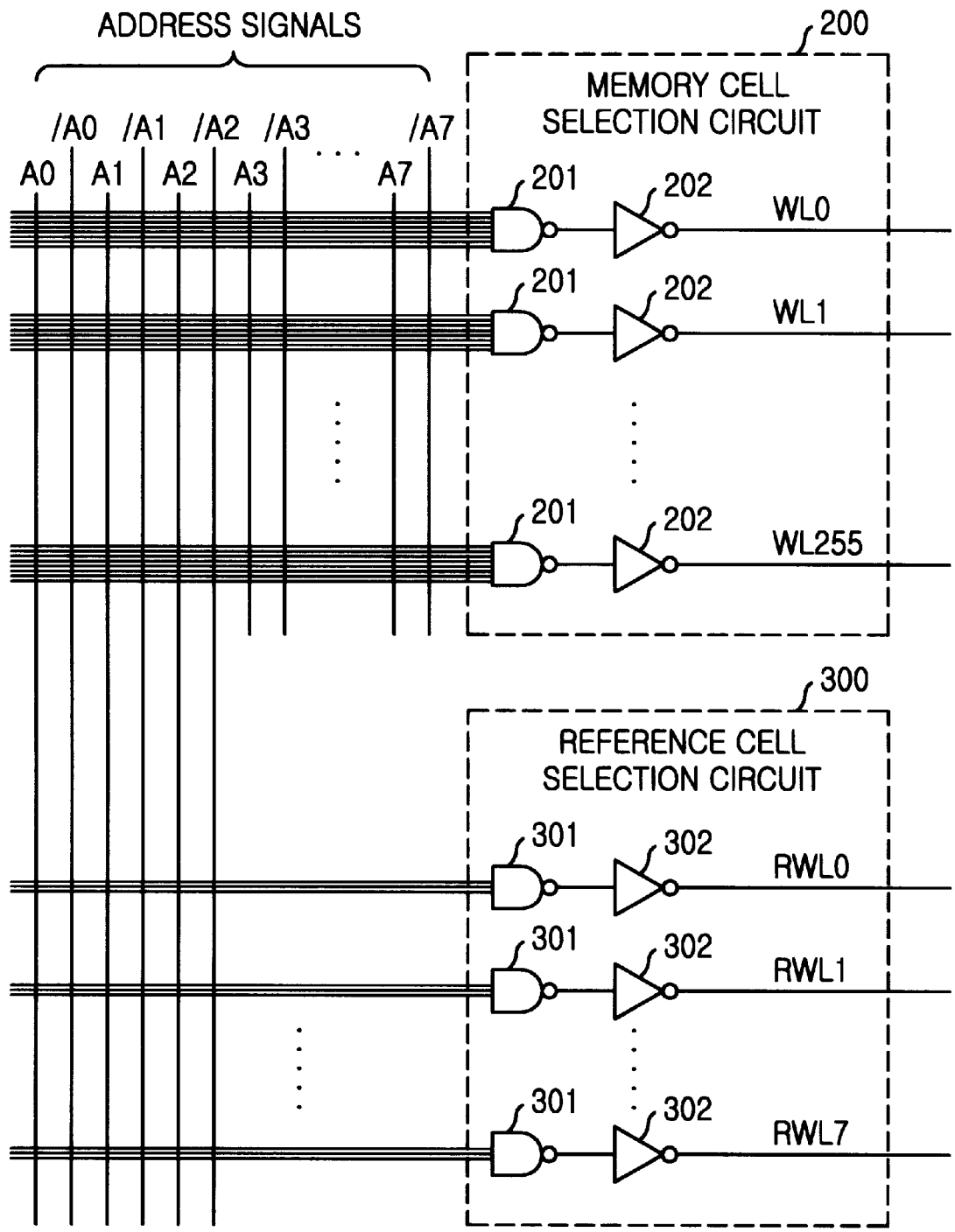
FIG. 2 is a circuit diagram showing a memory cell selection circuit and a reference cell selection circuit connected to FIG.

Referring to FIG. 2, the memory cells 10 shown in FIG. 1 are connected to a memory cell selection circuit 200 and the reference cells 20 shown in FIG. 1 are connected to a reference cell selection circuit 300.

The memory cell selection circuit 200 includes NAND gates 201 and inverters 202 to generate a memory cell selection signal in response to address signals. Also, the reference cell selection circuit 300 includes NAND gates 301 and inverters 302 to generate a reference cell selection signal to select a corresponding reference cell.

When it is assumed that the memory cell selection circuit 200 is connected to the memory cells 10 via 256 word lines WL0 to WL255, a NAND gate 201 receives eight address signals from an external circuit. The NAND gate 201 performs NAND logical operation, and an inverter 202 inverts an output signal of the NAND gate 201 to generate the memory cell selection signal, wherein the NAND gate 201 has eight input terminals.

The reference cell selection circuit 300 includes NAND gates 301 and inverters 302 to generate a reference cell selection signal. When it is assumed that the reference cell selection circuit 300 is connected to the reference cells via eight reference word lines RWL0 to RWL7, a NAND gate 301 receives three address signals from the external circuit. The NAND gate 301 performs NAND logical operation and an inverter 302 inverts an output signal of the NAND gate 301 to generate the reference cell selection signal, wherein the NAND gate 301 has three input terminals.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A ferroelectric random access memory (FeRAM) device, comprising:

a plurality of memory cells arranged in an M×J matrix, wherein M is $2^N$, N is a positive integer greater than 1 and J is a positive integer;

a number of reference cells connected to each column of the memory cells, wherein the number of reference cells is N; and a cell selection means for selecting a memory cell in response to address signals from an external circuit and selecting a reference cell corresponding to the selected memory cell.

2. The FeRAM device as recited in claim 1, wherein said cell selection means includes:

a memory cell selection circuit connected to the memory cells via word lines for generating a memory cell selection signal in response to the address signals to select a corresponding memory cell; and a reference cell selection circuit connected to the reference cells via reference word lines for generating a reference cell selection signal to select the corresponding reference cell.

3. The FeRAM device as recited in claim 2, wherein said memory cell selection circuit includes:

a plurality of NAND gates, each NAND gate for receiving address signals from an external circuit to perform NAND logical operation; and a plurality of inverters, each inverter for inverting an output signal of each NAND gate to generate the memory cell selection signal.

4. The FeRAM device as recited in claim 2, wherein said reference cell selection circuit includes:

a plurality of NAND gates, each NAND gate for receiving address signals from an external circuit to perform NAND logical operation; and a plurality of inverters, each inverter for inverting an output signal of each NAND gate to generate the reference cell selection signal.

5. The FeRAM device as recited in claim 1, wherein the number of the memory cells is $2^8$ and the number of the reference cells is eight.

6. The FeRAM device as recited in claim 3, wherein each NAND gate of said memory cell selection circuit has eight input terminals.

7. The FeRAM device as recited in claim 4, wherein each NAND gate of said reference cell selection circuit has three input terminals.

8. The FeRAM device as recited in claim 1, wherein said memory cells have one transistor and one ferroelectric capacitor, respectively.

9. The FeRAM device as recited in claim 1, wherein said reference cells have one transistor and one ferroelectric capacitor, respectively.

10. The FeRAM device as recited in claim 1, wherein said memory cells are connected to first bit line.

11. The FeRAM device as recited in claim 10, wherein said reference cells are connected to second bit line.

12. The FeRAM device as recited in claim 11, wherein said memory cells and said reference cells shares a cell plate, wherein the cell plate is positioned between the first bit line and the second bit line.

* * * * *

UNITED STATES PATENT AND TRADEMARK OFFICE
CERTIFICATE OF CORRECTION

PATENT NO. : 6,178,107 B1  
DATED : January 23, 2001  
INVENTOR(S) : Kang

Page 1 of 1

It is certified that error appears in the above-identified patent and that said Letters Patent is hereby corrected as shown below:

Item [75],
Inventor, please delete "Ichon" and insert -- Ichon-Shi --.

In the Brief Description of the Drawings, Figure 2, line 3, after FIG. Please insert -- 1. --.

Signed and Sealed this

First Day of January, 2002

Attest:

Attesting Officer

JAMES E. ROGAN
Director of the United States Patent and Trademark Office